(12) United States Patent
Hasegawa et al.

(10) Patent No.: US 7,606,276 B2
(45) Date of Patent: Oct. 20, 2009

(54) NITRIDE SEMICONDUCTOR DEVICE AND METHOD FOR FABRICATING THE SAME

(75) Inventors: Yoshiaki Hasegawa, Shiga (JP); Akihiko Ishibashi, Osaka (JP); Toshiya Yokogawa, Nara (JP)

(73) Assignee: Panasonic Corporation, Kadoma (JP)

( * ) Notice: Subject to any disclaimer, the term of this patent is extended or adjusted under 35 U.S.C. 154(b) by 308 days.

(21) Appl. No.: 11/570,147

(22) PCT Filed: May 12, 2006

(86) PCT No.: PCT/JP2006/030955

§ 371 (c)(1),
(2), (4) Date: Dec. 7, 2006

(87) PCT Pub. No.: WO2006/123580

PCT Pub. Date: Nov. 23, 2006

(65) Prior Publication Data

US 2008/0273562 A1  Nov. 6, 2008

(30) Foreign Application Priority Data

May 19, 2005 (JP) .............................. 2005-146676

(51) Int. Cl.
*H01S 5/00* (2006.01)
*H01S 3/097* (2006.01)
(52) U.S. Cl. ..................... 372/43.01; 372/87
(58) Field of Classification Search .............. 372/43.01, 372/87
See application file for complete search history.

(56) References Cited

U.S. PATENT DOCUMENTS

| 6,791,120 B2 | 9/2004 | Toda et al. |
| 2005/0030994 A1 | 2/2005 | Kozaki et al. |
| 2005/0184299 A1 | 8/2005 | Matsumura et al. |

FOREIGN PATENT DOCUMENTS

| JP | 2002-016312 | 1/2002 |
| JP | 2004-006718 | 1/2004 |
| JP | 2004-071657 | 3/2004 |
| JP | 2004-172568 | 6/2004 |

OTHER PUBLICATIONS

International Search Report for corresponding Application No. PCT/JP2006/309550 mailed Jun. 6, 2006.
Form PCT/ISA/237 for corresponding Application No. PCT/JP2006/309550 and a concise explanation.

*Primary Examiner*—Armando Rodriguez
(74) *Attorney, Agent, or Firm*—Renner, Otto, Boisselle & Sklar, LLP

(57) ABSTRACT

A nitride semiconductor device 100 according to the present invention includes: an n-GaN substrate 1; a semiconductor multilayer structure, which has been formed on the principal surface of the n-GaN substrate 1 and which includes a p-type region and an n-type region; a p-electrode 32, which makes contact with a portion of the p-type region included in the semiconductor multilayer structure; and an n-electrode 34, which is arranged on the bottom surface of the substrate 1. The bottom surface of the substrate 1 includes a roughened region 40*a* and a flattened region 40*b*. And the n-electrode 34 covers the roughened region 40*a* at least partially.

20 Claims, 7 Drawing Sheets

(a)

10 N-Type GaN Substrate
Top Surface of Substrate
Ridge Stripe
50 Cleavage Guide (b)

40b Flattened Region
42 Mask Layer
Bottom Surface of Substrate
40a Roughened Region
10 N-Type GaN Substrate
50 Cleavage Guide
52 Cleavage Line 10 N-Type GaN Substrate 34 N-Electrode (Ti/Pt/Au)   40a Roughened Region 40b Flattened Region

NITRIDE SEMICONDUCTOR DEVICE AND METHOD FOR FABRICATING THE SAME

TECHNICAL FIELD

The present invention relates to a nitride semiconductor device and a method for fabricating such a device.

BACKGROUND ART

A blue-violet semiconductor laser, made of Group III-V nitride semiconductors ($Al_xGa_yIn_{1-x-y}N$ (where $0 \leq x \leq 1$ and $0 \leq y \leq 1$)) such as gallium nitride (GaN), is a key device for realizing ultrahigh density recording by optical disk drives, and is about to be actually used in consumer electronics products. The output of a blue-violet semiconductor laser must be increased not just to enable high-speed writing on an optical disk but also to develop new fields of technology including application to laser displays.

Recently, a GaN substrate has been regarded as a strong candidate for a substrate for fabricating a nitride semiconductor device thereon. This is because a GaN substrate is superior in the degree of crystal lattice matching and heat dissipation ability to a sapphire substrate that has been used in the pertinent art. Another advantage is that the GaN substrate has electrical conductivity, whereas the sapphire substrate is an insulator. That is to say, a structure in which current also flows across a GaN substrate can be adopted by arranging an additional electrode on the bottom surface of the GaN substrate, too. If an electrode is arranged on the bottom surface of a GaN substrate with electrical conductivity, then the size (i.e., the chip area) of each semiconductor device can be reduced, thus increasing the number of chips that can be made out of a single wafer. As a result, the manufacturing cost can be reduced.

Semiconductor lasers, including an n-electrode on the bottom surface of a GaN substrate, are disclosed in Patent Documents Nos. 1 to 3, for example.

Patent Document No. 1: Japanese Patent Application Laid-Open Publication No. 2002-16312

Patent Document No. 2: Japanese Patent Application Laid-Open Publication No. 2004-71657

Patent Document No. 3: Japanese Patent Application Laid-Open Publication No. 2004-6718

DISCLOSURE OF INVENTION

Problems to be Solved by the Invention

However, if an n-electrode is arranged on the bottom surface of a GaN substrate, the electrical contact properties thereof are poor, which is a problem. Thus, in the prior art, people try to improve the contact properties by creating unevenness on the bottom surface of the substrate as disclosed in these patent documents.

Nevertheless, the present inventors discovered that the contact resistance could not be reduced sufficiently according to the conventional methods. We also discovered that if the technique of creating such unevenness on the bottom surface of the substrate was adopted on a mass-production scale, then it became difficult to fabricate semiconductor laser devices at a good yield for the reasons to be described in detail later.

In order to overcome the problems described above, an object of the present invention is to provide a nitride semiconductor device, which can be fabricated at a good yield with the electrical contact properties improved on the bottom surface of the substrate, and a method for fabricating such a semiconductor device.

Means for Solving the Problems

A nitride semiconductor device according to the present invention includes: a nitride-based semiconductor substrate containing an n-type dopant; a semiconductor multilayer structure formed on the principal surface of the semiconductor substrate, the structure including a p-type region and an n-type region; a p-electrode being in contact with a portion of the p-type region included in the semiconductor multilayer structure; and an n-electrode arranged on the bottom surface of the semiconductor substrate. The bottom surface of the semiconductor substrate includes a flattened region and a roughened region. And the n-electrode covers the roughened region at least partially.

In one preferred embodiment, the flattened region on the bottom surface of the semiconductor substrate has the shape of a band with a width of 20 µm or more and surrounds the roughened region.

In another preferred embodiment, the contours of an area of contact between the bottom surface of the semiconductor substrate and the n-electrode are aligned with the boundary between the flattened region and the roughened region.

In still another preferred embodiment, the roughened region on the bottom surface of the semiconductor substrate has been subjected to a polishing process or a cleaning process.

In yet another preferred embodiment, the principal surface of the semiconductor substrate has +C polarity.

In yet another preferred embodiment, the flattened region on the bottom surface of the semiconductor substrate has −C polarity.

In yet another preferred embodiment, the roughened region on the bottom surface of the semiconductor substrate includes a plurality of recessed portions or raised portions that have been formed by an etching process.

In yet another preferred embodiment, the roughened region on the bottom surface of the semiconductor substrate includes a plurality of facets with multiple different plane orientations.

In yet another preferred embodiment, on the bottom surface of the semiconductor substrate, the roughened region has a level difference of 10 nm to 1 µm and the flattened region has a level difference of less than 10 nm.

In yet another preferred embodiment, the n-electrode covers the roughened region entirely on the bottom surface of the semiconductor substrate.

In yet another preferred embodiment, the flattened region on the bottom surface of the semiconductor substrate is arranged so as to be in contact with a cleaved portion.

In yet another preferred embodiment, the n-electrode includes a layer that is made of at least one metal selected from the group consisting of Ti, Al, Pt, Au, Mo, Sn, In, Ni, Cr, Nb, Ba, Ag, Rh, Ir, Ru and Hf or an alloy thereof.

In yet another preferred embodiment, the n-electrode has a contact resistivity of $5 \times 10^{-4}$ $\Omega \cdot cm^2$ or less.

A method for fabricating a nitride semiconductor device according to the present invention includes the steps of: providing a nitride-based semiconductor substrate containing an n-type dopant; forming a semiconductor multilayer structure, including a p-type region and an n-type region, on the principal surface of the semiconductor substrate; forming a p-electrode on the p-type region that is included in the semiconductor multilayer structure; and forming an n-electrode on the bottom surface of the semiconductor substrate that includes a nitrogen plane. The method further includes the steps of: defining a flattened region and a roughened region on the bottom surface of the semiconductor substrate before the n-electrode is formed there; and cleaving the semiconductor substrate such that a cleaved surface runs through the flattened region after the n-electrode has been formed.

In one preferred embodiment, the method further includes the step of reducing the concentration of carbon on the bottom surface of the semiconductor substrate after the step of defining the flattened region and the roughened region on the bottom surface of the semiconductor substrate has been performed and before the step of forming the n-electrode on the bottom surface of the semiconductor substrate is performed.

In another preferred embodiment, the step of reducing the carbon concentration includes the steps of: forming an insulating film on the bottom surface of the semiconductor substrate; and removing the insulating film.

In still another preferred embodiment, the step of reducing the carbon concentration includes the steps of: depositing a silicon dioxide film on the bottom surface of the semiconductor substrate; and removing the silicon dioxide film.

In yet another preferred embodiment, the step of defining the roughened region includes the steps of: forming a mask layer, which has an opening to expose a portion of the bottom surface of the semiconductor substrate where the roughened region will be defined, on the bottom surface of the semiconductor substrate; and subjecting that portion of the bottom surface of the semiconductor substrate where the roughened region will be defined to an etching process.

In yet another preferred embodiment, the step of forming the n-electrode includes the steps of: depositing a metallic electrode layer over the mask layer on the bottom surface of the semiconductor substrate; and patterning the metallic electrode layer into the n-electrode by removing a portion of the metallic electrode layer, which is located on the mask layer, along with the mask layer.

EFFECTS OF THE INVENTION

According to the present invention, a roughened region, defined in an interface between the bottom surface of a nitride-based semiconductor substrate and an n-electrode, can increase the effective area of the contact interface and can reduce the concentration of carbon in the contact interface. As a result, the n-electrode can have improved contact properties. In addition, since the substrate can be cleaved more easily, semiconductor laser diodes can be fabricated at a good yield.

Figure 1:
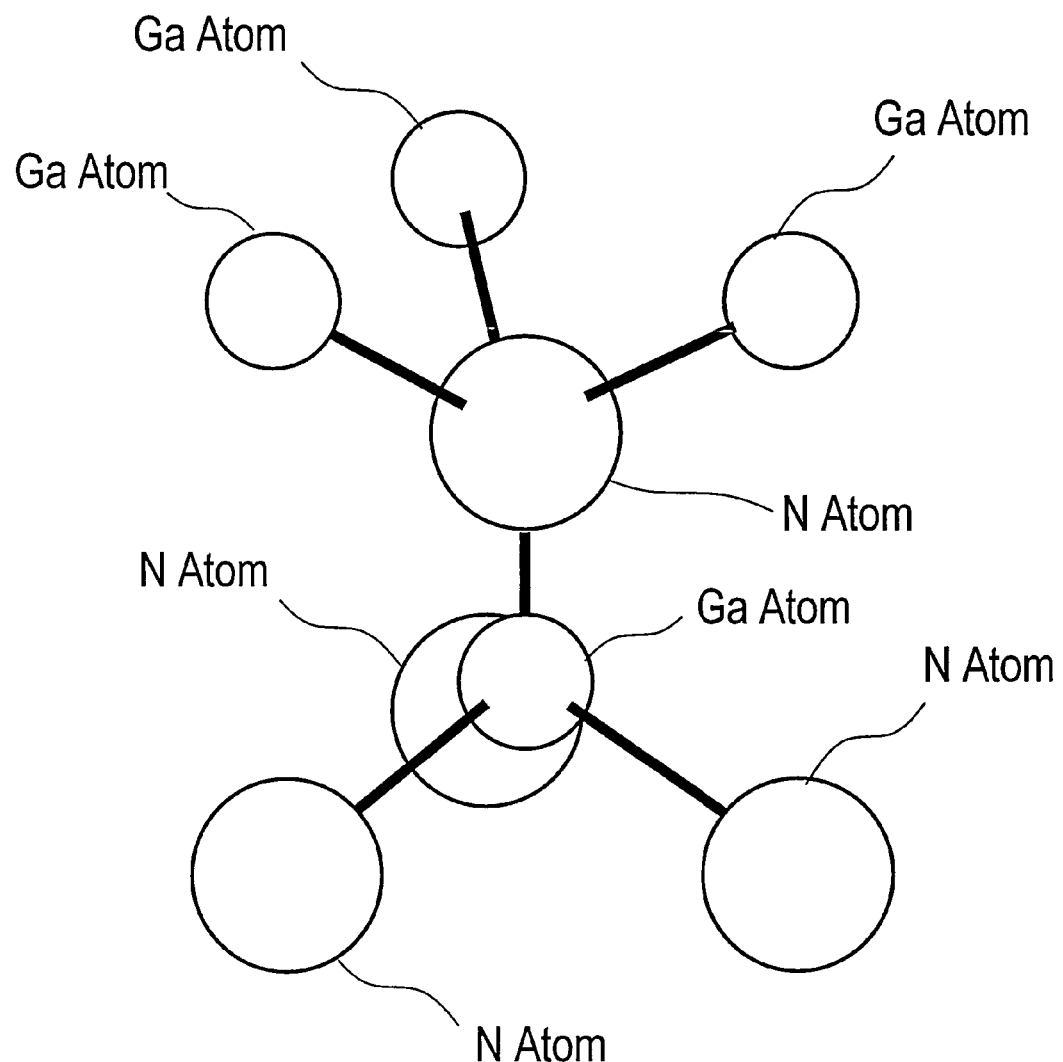
FIG. 1 is a perspective view schematically illustrating a GaN crystal structure of a GaN substrate.

| DESCRIPTION OF REFERENCE NUMERALS | |
|---|---|
| 10 | n-type GaN substrate |
| 10a | bar |
| 12 | n-type GaN layer |
| 14 | n-type AlGaN cladding layer |
| 16 | GaN optical guide layer |
| 18 | InGaN multi-quantum well layer |
| 20 | InGaN intermediate layer |
| 22 | p-type AlGaN cap layer |
| 24 | p-type GaN optical guide layer |
| 26 | p-type AlGaN cladding layer |
| 28 | p-type GaN contact layer |
| 30 | $SiO_2$ layer |
| 32 | p-electrode (Pd/Pt) |
| 34 | n-electrode (Ti/Pt/Au) |
| 36 | $SiO_2$ layer |
| 40a | roughened region on bottom surface of substrate |
| 40b | flattened region on bottom surface of substrate |
| 50 | cleavage guide |
| 100 | semiconductor multilayer structure |

BEST MODE FOR CARRYING OUT THE INVENTION

The present inventors discovered via experiments that the high electrical contact resistance of the n-electrode, arranged on the bottom surface of a nitride semiconductor substrate, was caused by carbon (C) existing on the bottom surface of the nitride semiconductor substrate. We also discovered that the contact resistance could be reduced effectively by decreasing the concentration of carbon in the interface between the bottom surface of the nitride semiconductor substrate and the n-electrode, thus acquiring the basic idea of the present invention.

As shown in FIG. 1, a GaN crystal is made up of Ga atoms and N atoms and has a hexagonal structure. The top surface of a GaN substrate, on which various semiconductor layers will grow epitaxially, is a plane in which Ga atoms are arranged to form a layer (which will be referred to herein as a "Ga plane" or a "+C polarity plane"). On the other hand, the bottom surface of the GaN substrate is a plane in which nitrogen atoms (N atoms) are arranged to form a layer (which will be referred to herein as a "nitrogen plane" or a "−C polarity plane"). The nitrogen plane (which will be referred to herein as the "N plane") has a property to always appear on the bottom surface of the GaN substrate even if the GaN substrate has its bottom surface polished and has its thickness reduced to an arbitrary value. Even in a normal nitride semiconductor substrate in which Ga atoms of the GaN substrate are replaced with Al atoms or In atoms at some sites, the bottom surface thereof is an N plane, too.

As a result of experiments, the present inventors discovered that the N plane of a nitride semiconductor substrate such as a GaN substrate easily adsorbs carbon and therefore, carbon continues to be present with good stability in the interface between the N plane and an electrode even after the electrode has been formed on the N plane. Even after the electrode has been subjected to a heat treatment process, this carbon still continues to be present on the interface stably without diffusing to surrounding regions and functions as an electrical barrier on the contact interface. Thus, if that carbon existing on the bottom surface of the substrate could be eliminated appropriately before the n-electrode is formed, the electrical barrier on the contact interface can be lowered and the contact properties of the n-electrode can be improved significantly.

If the bottom surface of the GaN substrate is made uneven and roughened, then the ratio of the area of the N plane to the entire bottom surface area of the substrate can be decreased. In the prior art, however, if the bottom surface of a GaN substrate is made uneven, then it becomes difficult to cleave the substrate at a good yield, which is a problem. Hereinafter, this problem will be discussed.

Since a GaN substrate has a hexagonal structure, it is very difficult to carry out the process step of cleaving the GaN substrate into respective semiconductor chips (with a substantially rectangular parallelepiped shape) at a good yield. To get this cleavage done at a good yield, it is effective to arrange a plurality of recessed portions (which will be referred to herein as "cleavage guides") on a specified cleavage line on the top surface of the GaN substrate and perform a primary cleavage along the cleavage guides and from the bottom surface of the substrate.

Since the GaN substrate has light transmitting property, the primary cleavage should be able to be carried out along the cleavage guides by checking the locations of the cleavage guides on the top surface of the substrate from the bottom surface thereof. However, if the entire bottom surface of the GaN substrate were made uneven, then the incoming light would be reflected diffusively from the bottom surface of the substrate and the cleavage guides could not be located from the bottom surface of the substrate anymore. That is why if the bottom surface of the GaN substrate were made uneven by a conventional technique, then the cleavage could not be carried out at a good yield.

In view of this consideration, according to the present invention, not the entire bottom surface of a nitride semiconductor substrate but only a selected region thereof is made uneven, thereby dividing the bottom surface of the substrate into a flattened region (window region) and a roughened region. And an n-electrode is formed so as to cover the roughened region at least partially.

As used herein, the "flattened region" refers to a plane that is smoother than the "roughened region". More particularly, the "flattened region" is a portion of the bottom surface of the substrate that has been kept planarized by a polishing process and means a region from which unevenness has been eliminated intentionally. Nevertheless, this "flattened region" may be subjected to a cleaning process after having been subjected to the polishing process. On the other hand, the "roughened region" is another portion of the bottom surface of the substrate that has been made uneven intentionally by an etching process, for example. If the etching process to roughen the surface is an anisotropic etching process that changes its etch rates according to the crystallographic plane orientation, then facets with multiple different plane orientations will be formed on the roughened region.

According to the present invention, no diffuse reflection is produced on the flattened region of the bottom surface of the substrate. That is why if the cleavage guides are made on the top surface of the substrate, the primary cleavage can be carried out appropriately by checking the cleavage guides from the bottom surface of the substrate.

Hereinafter, a method for fabricating a nitride semiconductor device according to the present invention will be described.

According to the present invention, first, a semiconductor multilayer structure is formed on the surface of a nitride semiconductor substrate (i.e., Ga surface) by a known semiconductor growth process including an epitaxial growth process. The semiconductor multilayer structure includes a p-type region and an n-type region. In fabricating a light-emitting element such as a semiconductor laser, the semiconductor multilayer structure has a double heterostructure and a structure for confining light and current within a predetermined space.

After a p-electrode that makes an electrical contact with the p-type region in the semiconductor multilayer structure has been formed on the top surface of the nitride substrate and before an n-electrode is formed on the bottom surface of the nitride semiconductor substrate, a special process step, i.e., the process step of roughening a predetermined region on the bottom surface of the nitride semiconductor substrate, is carried out according to the present invention. This process step may be carried out by covering a portion of the bottom surface of the substrate with a mask layer and then etching the non-masked region of the substrate.

In a preferred embodiment, after the roughened region and the flattened region have been defined on the bottom surface of the substrate, a surface treatment is performed to reduce the concentration of carbon. This treatment includes the steps of covering the bottom surface of the nitride semiconductor substrate with a layer of a deposited material and etching away that layer. More preferably, after a silicon dioxide ($SiO_2$) film has been deposited on the bottom surface of the nitride semiconductor substrate, the $SiO_2$ film is removed from the bottom surface. The present inventors discovered and confirmed via experiments that by subjecting the bottom surface of the substrate to this treatment (including the process steps of depositing an $SiO_2$ film and removing the film), the concentration of carbon on the bottom surface of the substrate could be reduced significantly and the contact resistance could be reduced as a result.

If the n-electrode is formed on the bottom surface of the nitride semiconductor substrate after these process steps (i.e., bottom surface treatment) have been performed, then the effective contact area increases in the interface between the bottom surface of the substrate and the n-electrode and the concentration of carbon in the interface can be reduced to less than a detection limit of a measuring system. As a result, the contact resistance can be reduced significantly.

In a preferred embodiment, a plurality of recessed portions defining a cleavage line (i.e., cleavage guides) are made on the top of the semiconductor multilayer structure that has been formed on the principal surface of the substrate. Such recessed portions can be easily be made by a combination of scribe and etching techniques.

After the n-electrode has been formed on the bottom surface of the substrate, a primary cleavage is carried out on the bottom surface of the substrate and along the cleavage guides being checked through the flattened region that is not covered with the n-electrode, thereby dividing the nitride semiconductor substrate into a number of bars. Thereafter, each of those bars is subjected to a secondary cleavage so as to be divided into respective semiconductor laser chips.

Embodiment 1

Hereinafter, a first preferred embodiment of a nitride semiconductor device and a method for fabricating the device according to the present invention will be described with reference to the accompanying drawings.

Figure 2:
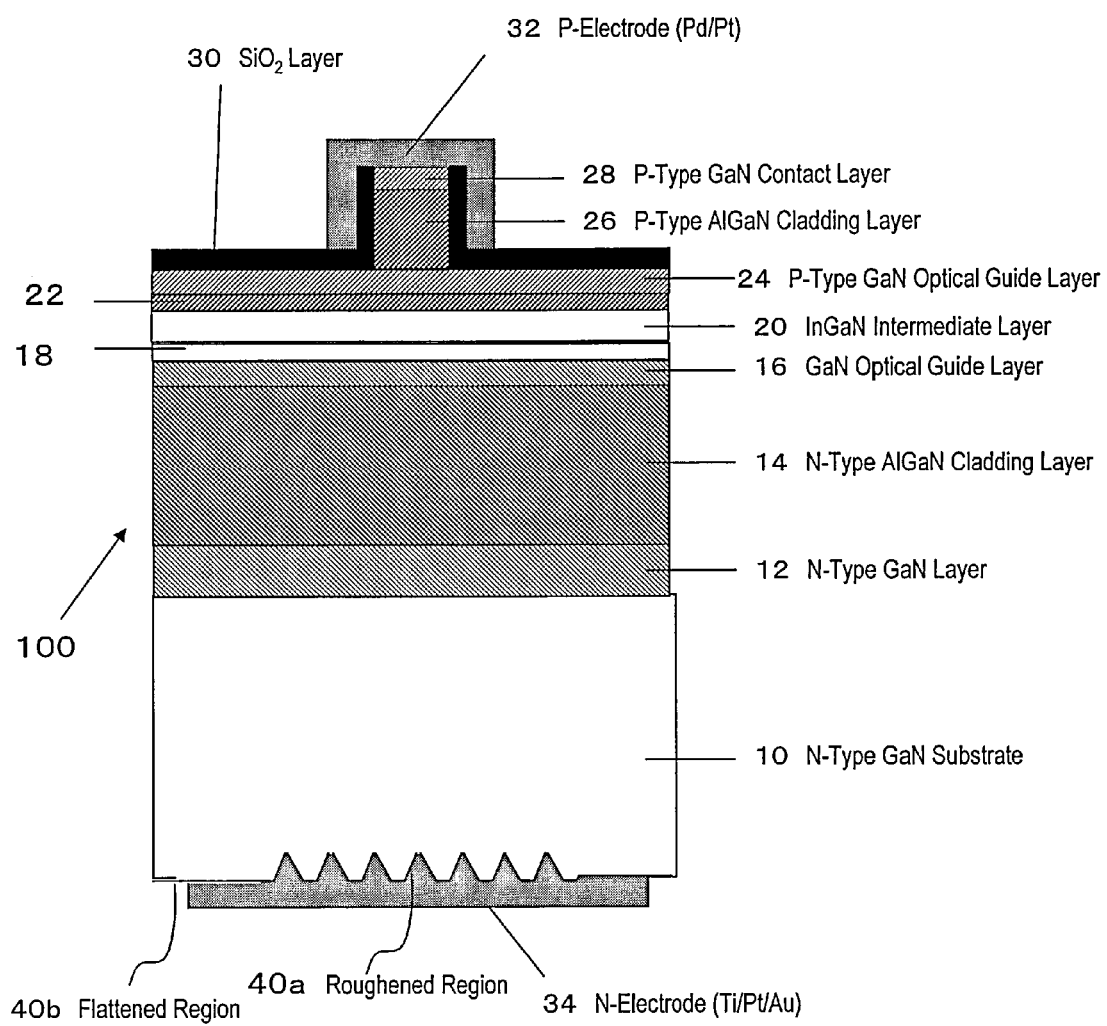
FIG. 2 is a cross-sectional view illustrating a first preferred embodiment of a nitride semiconductor device according to the present invention.

First, referring to FIG. 2, illustrated schematically is a cross section of a nitride semiconductor device according to this preferred embodiment, i.e., a GaN-based semiconductor laser. The cross section of the device shown in FIG. 2 is parallel to an end facet of the resonant cavity thereof, and the resonant cavity length direction is perpendicular to this cross section.

The semiconductor laser of this preferred embodiment includes an n-type GaN substrate 10 (with a thickness of about 100 μm) that has been doped with an n-type dopant and a semiconductor multilayer structure 100 that has been formed on the surface (Ga plane) of the n-type GaN substrate 10.

The semiconductor multilayer structure 100 includes an n-type GaN layer 12, an n-type AlGaN cladding layer 14, a GaN optical guide layer 16, an InGaN multi-quantum well layer 18, an InGaN intermediate layer 20, a p-type AlGaN cap layer 22, a p-type GaN optical guide layer 24, a p-type AlGaN cladding layer 26 and a p-type GaN contact layer 28.

The respective semiconductor layers included in the semiconductor multilayer structure 100 of this preferred embodiment may have the dopant concentrations and thicknesses that are shown in the following Table 1:

TABLE 1

| Semiconductor layer | Dopant concentration | Thickness |
|---|---|---|
| n-GaN layer 12 | Si: $5 \times 10^{17}$ cm$^{-3}$ | 1 μm |
| n-AlGaN cladding layer 14 | Si: $5 \times 10^{17}$ cm$^{-3}$ | 1.5 μm |
| GaN optical guide layer 16 | | 120 nm |
| InGaN multi-quantum well layer 18 | | 3 nm (active layer) and 9 nm (barrier layer) |
| InGaN intermediate layer 20 | | 80 nm |
| p-AlGaN cap layer 22 | Mg: $1 \times 10^{19}$ cm$^{-3}$ | 20 nm |
| p-GaN optical guide layer 24 | Mg: $1 \times 10^{19}$ cm$^{-3}$ | 20 nm |
| p-AlGaN cladding layer 26 | Mg: $1 \times 10^{19}$ cm$^{-3}$ | 0.5 μm |
| p-GaN contact layer 28 | Mg: $1 \times 10^{20}$ cm$^{-3}$ | 0.1 μm |

It should be noted that the dopants, dopant concentrations and thicknesses of the respective semiconductor layers shown in Table 1 are just examples and the present invention is in no way limited to these specific examples.

Figure 5:
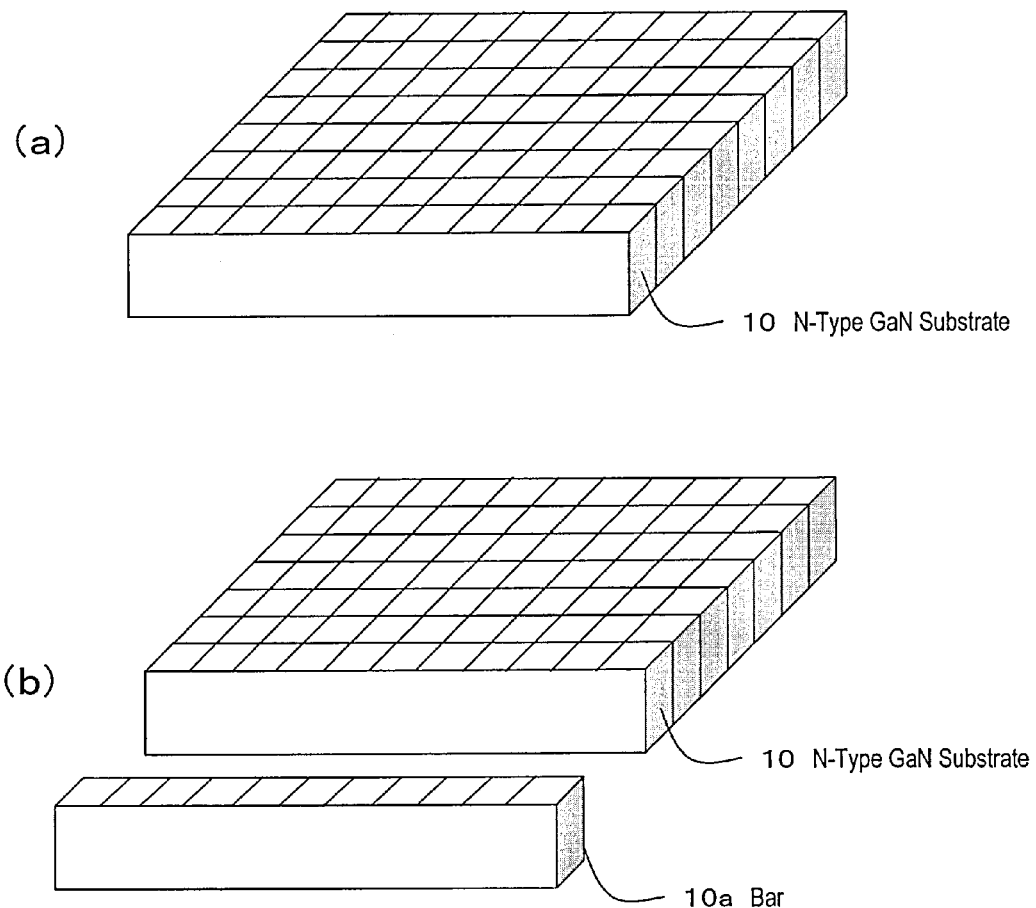
FIGS. 5(a) and 5(b) are perspective views schematically showing how to perform primary cleavage.

In the semiconductor multilayer structure 100, the p-type GaN contact layer 28 and the p-type AlGaN cladding layer 26 have been patterned into the shape of a ridge stripe that extends in the resonant cavity length direction. The ridge stripe may have a width of about 1.5 μm, while the resonant cavity may have a length of 600 μm, for example. The chip width (i.e., a size of the element as measured parallel to the respective semiconductor layers in FIG. 5) may be 200 μm, for example.

The upper surface of the semiconductor multilayer structure 100 is entirely covered with an SiO$_2$ layer 30 except the upper surface of the ridge stripe. A striped opening to expose the upper surface of the ridge stripe has been cut through the center portion of the SiO$_2$ layer 30. Through that opening of the SiO$_2$ layer 30, the surface of the p-type GaN contact layer 28 makes contact with a p-electrode (Pd/Pt) 32.

The bottom surface of the n-type GaN substrate 10 has been divided into a roughened region 40a with unevenness and a flattened region 40b with no unevenness. An n-electrode (Ti/Pt/Au) 34 has been formed so as to cover the roughened region. The unevenness of the roughened region 40a may have a level difference of 10 nm (preferably 50 nm or more) to 1 μm, while the unevenness of the flattened region 40b may have a level difference of 1 nm to 10 nm, for example.

In this preferred embodiment, the concentration of carbon in the interface between the bottom surface of the n-type GaN substrate 10 and the n-electrode 34 has been reduced to 5 at % or less, more particularly 2 at % or less.

Hereinafter, a preferred embodiment of a method for fabricating the nitride semiconductor device of this preferred embodiment will be described.

First, an n-type GaN substrate 10, made by a known process, is provided. The n-type GaN substrate 10 may have a thickness of about 400 μm, for example, and has had its surface planarized by a polishing process.

Next, a semiconductor multilayer structure 100 is formed on the surface of the n-type GaN substrate 10. The semiconductor multilayer structure 100 may be formed by a known epitaxial growth process, for example. The respective semiconductor layers may be grown in the following manner, for example.

First, the n-type GaN substrate 10 is loaded into the chamber of a metalorganic vapor phase epitaxy (MOVPE) system. Then, the surface of the n-type GaN substrate 10 is subjected to a heat treatment process (i.e., a thermal cleaning process) at a temperature of about 500° C. to about 1,100° C. This heat treatment process may be carried out at 750° C. for at least one minute, preferably five minutes or more. During this heat treatment process, a gas including nitrogen (N) atoms (such as N$_2$, NH$_3$ or hydrazine) is preferably supplied into the chamber.

Thereafter, the temperature of the reaction furnace is controlled to about 1,000° C., trimethylgallium (TMG) and ammonia (NH$_3$) as source gases and hydrogen and nitrogen as carrier gases are supplied at the same time, and silane (SiH$_4$) gas is further supplied as an n-type dopant, thereby growing an n-type GaN layer 12 having a thickness of about 1 μm and a dopant (Si) concentration of about $5 \times 10^{17}$ cm$^{-3}$.

Subsequently, with trimethylaluminum (TMA) further supplied, an n-type AlGaN cladding layer 14, made of Al$_{0.05}$Ga$_{0.95}$N with a thickness of about 1.5 μm and a dopant (Si) concentration of approximately $5 \times 10^{17}$ cm$^{-3}$, is grown. Then, after a GaN optical guide layer 16 made of GaN has been grown to a thickness of about 120 μm, the temperature is lowered to about 800° C., the carrier gases are changed into nitrogen gas, and trimethylindium (TMI) and TMG are supplied, thereby growing a multi-quantum well active layer 18 consisting of three quantum wells with a thickness of about 3 nm and made of In$_{0.10}$Ga$_{0.90}$N and two In$_{0.02}$Ga$_{0.98}$N barrier layers with a thickness of about 9 nm. Thereafter, an InGaN intermediate layer 20 made of In$_{0.01}$Ga$_{0.99}$N is grown. The InGaN intermediate layer 20 can reduce the diffusion of a p-type dopant (Mg) from the p-type semiconductor layers to be deposited thereon to the active layer 18 and can keep the quality of the active layer 18 high even after the crystal growing process.

Subsequently, the temperature in the reaction furnace is raised again to about 1,000° C., nitrogen and hydrogen are supplied as carrier gases, and biscyclopentadienyl magnesium (Cp$_2$Mg) gas is supplied as a p-type dopant, thereby growing a p-type AlGaN cap layer 22 made of Al$_{0.20}$Ga$_{0.80}$N with a thickness of about 20 nm and a dopant (Mg) concentration of about $1 \times 10^{19}$ cm$^{-3}$.

Then, a second GaN optical guide layer 24 made of p-type GaN is grown so as to have a thickness of about 20 nm and a dopant (Mg) concentration of about $1 \times 10^{19}$ cm$^{-3}$. Thereafter, a p-type AlGaN cladding layer 26 made of Al$_{0.05}$Ga$_{0.95}$N is grown so as to have a thickness of about 0.05 μm and a dopant concentration of about $1 \times 10^{19}$ cm$^{-3}$. Finally, a p-type GaN contact layer 28 is grown so as to have a thickness of about 0.1 μm and a dopant (Mg) concentration of about $1 \times 10^{20}$ cm$^{-3}$.

Next, the process step of making a plurality of recessed portions (i.e., the cleavage guides) 50 on the upper surface of the semiconductor multilayer structure will be described with reference to FIG. 3(a), which is a plan view illustrating a portion of the semiconductor substrate as viewed from over the upper surface thereof. Columns of cleavage guides 50 are arranged periodically along the lines on which the cleavage should be carried out and serve to get the cleavage done along those lines. The respective recessed portions functioning as the cleavage guides 50 may have a depth of 1 μm to 20 μm, a width of 1 μm to 5 μm and a length of 1 μm to 40 μm and may be formed by a combination of scribe and etching processes. In the example illustrated in FIG. 3(a), the arrangement pitch of the recessed portions corresponds to that of semiconductor laser device regions on the substrate. However, as long as the cleavage can be guided in an appropriate direction, the recessed portions may have any arbitrary shape or arrangement pitch. Nevertheless, these recessed portions preferably have a diamond shape, which has an acute angle in the cleavage direction, as viewed from over the substrate, and an anchor cross-sectional shape perpendicularly to the substrate. If the substrate is cleaved from the bottom surface thereof by using the columns of recessed portions in such a shape as cleavage guides, the cleavage can easily advance straight along the columns of the recessed portions and the yield of the cleavage increases.

Thereafter, the n-type GaN substrate 10 has its bottom surface polished so as to have its thickness reduced to about 100 μm. Next, as shown in FIG. 3(b), a mask layer 42 with a lattice shape is formed on the bottom surface of the n-type GaN substrate 10 and then the portions that are not covered with the mask layer 42 are exposed to an etchant, thereby forming a lot of etch pits or protrusions and roughening the surface. By performing this etching process at room temperature for 10 to 60 minutes using potassium hydroxide (KOH) or thermal phosphoric acid as the etchant, pits can be made at a number density of $5 \times 10^6$ pits/cm$^2$ and at a depth of 10 nm to 1,000 nm. The roughened region 40a may also be defined by a dry etching process instead of, or in addition to, the wet etching process described above.

The mask layer 42 has a plurality of openings that define the locations and shapes of the roughened regions 40a and may be formed by exposing and developing a resist film, for example. The portions of the bottom surface of the n-type GaN substrate 10 that are covered with the mask layer 42 will be subjected to either the primary cleavage or secondary cleavage. The portions of the bottom surface of the n-type GaN substrate 10 that have been covered with the mask layer 42 have no etch pits at all and function as the flattened regions 40b.

According to this preferred embodiment, the roughened regions 40a are defined by the method described above on the portion of the bottom surface of the substrate where the n-electrode 34 will be formed, and therefore, the percentage of the overall area of the N planes to the contact interface can be decreased and the surface area can be increased. This means that the carbon concentration can be reduced effectively in the contact interface and the effective area of contact can be increased. As a result, the contact resistance can be reduced.

After that, according to this preferred embodiment, an SiO$_2$ film is deposited by an ECR sputtering process to a thickness of about 0.5 μm to about 1.5 μm on the bottom surface (polished surface) of the n-type GaN substrate 10 to further reduce the contact resistance. Thereafter, the SiO$_2$ film is etched away from the bottom surface of the n-type GaN substrate 10. The SiO$_2$ film needs to be removed completely from at least a portion of the bottom surface of the n-type GaN substrate 10 where the n-electrode should be formed. In this preferred embodiment, the SiO$_2$ film is removed with hydrofluoric acid. However, the etchant for removing the SiO$_2$ film does not have to be hydrofluoric acid but may also be any other type of etchant. Also, the SiO$_2$ film does not have to be removed by such a wet etching process but may also be removed by either a dry etching process or a combination of wet etching and dry etching processes. Even if the bottom surface of the substrate is made uneven, some N planes may remain on the roughened regions 42. Those N planes may adsorb carbon and deteriorate the contact property. That is why this bottom surface treatment (carbon reducing treatment) is preferably carried out.

Subsequently, respective metal layers of Ti, Pt and Au are continuously deposited in this order on the bottom surface of the n-type GaN substrate 10. Thereafter, the mask layer 42 is removed, thereby lifting off excessive portions of the metal layers on the mask layer 42. In this manner, an n-electrode 34 is formed of the metal layers remaining on the roughened regions 40a. After that, a sintering process is carried out at about 300° C. within nitrogen atmosphere. This sintering process has the effect of further reducing the contact resistance of the n-electrode 34. According to this preferred embodiment, the contact resistivity of the n-electrode 34 can be reduced to $5 \times 10^{-4}$ Ω·cm or less.

According to this preferred embodiment, the n-electrode 34 has been patterned by using the mask layer 42 to define the roughened regions 40a, and therefore, the contours of a region where the bottom surface of the n-type GaN substrate 10 and the n-electrode 34 contact with each other are aligned with the boundary between the roughened region 40a and the flattened region 40b.

Figure 4:
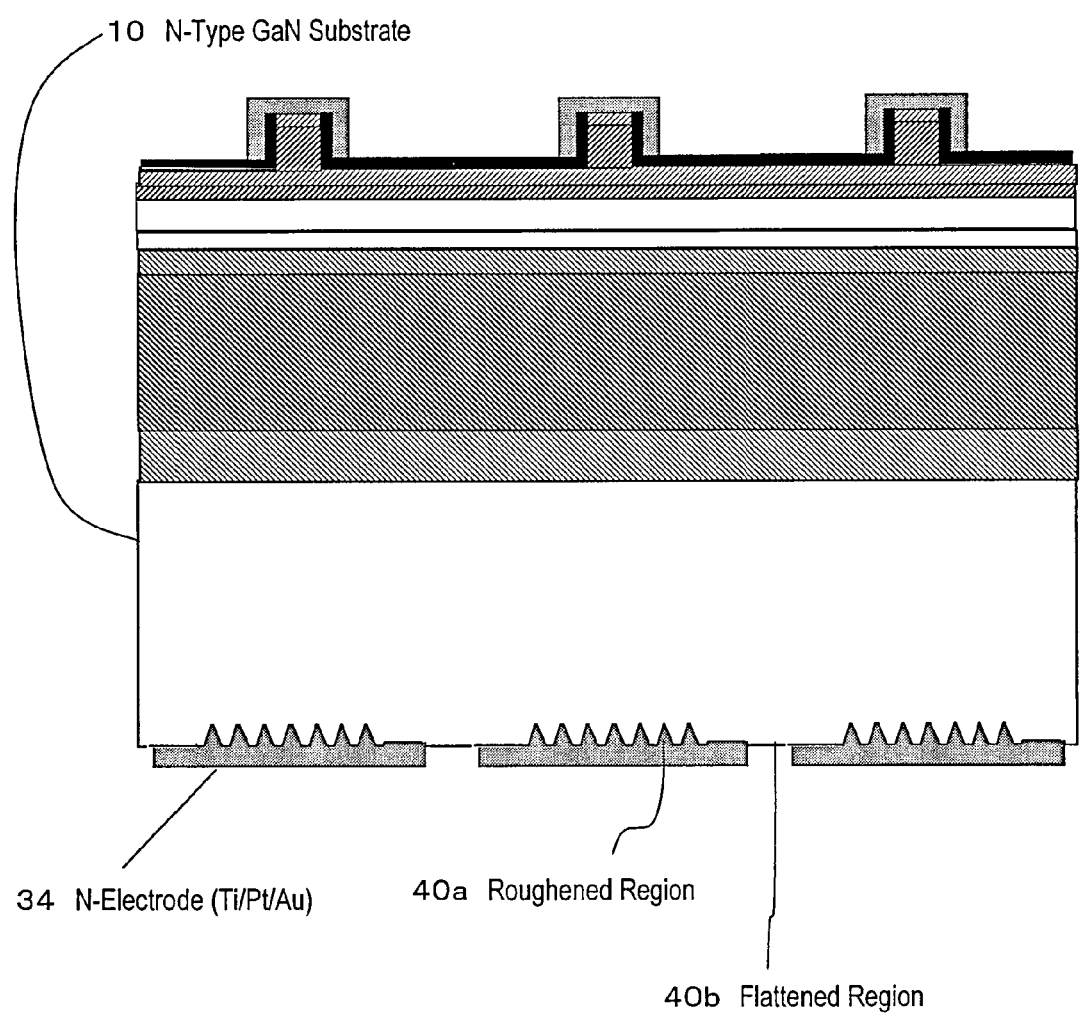
FIG. 4 is a cross-sectional view illustrating the main portions of nitride semiconductor devices according to the first preferred embodiment before the substrate is cleaved.

FIG. 4 is a cross-sectional view illustrating a portion of the n-type GaN substrate 10 on which the n-electrode 34 has already been formed. As can be seen from FIG. 4, unevenness has been created by the etching process on portions of the bottom surface of the substrate (i.e., on the roughened regions). Such unevenness is defined by facets on which crystallographic planes, other than (000-1) planes, are exposed. In this preferred embodiment, the roughened regions have a plurality of raised portions that have been defined by the etching process. Each of those raised portions (with a height of 10 nm to 1,000 nm) has either a polygonal pyramid shape or a polygonal prismoid shape, and its surfaces are facets other than the (000-1) plane.

Figure 3:
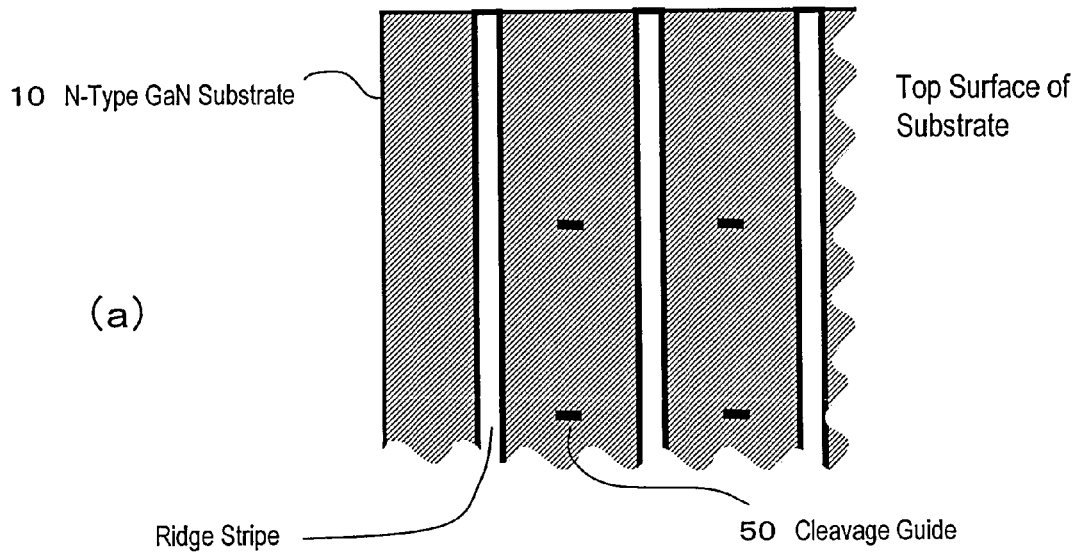
FIG. 3(a) is a plan view showing a portion of the top surface of a nitride semiconductor substrate according to the first preferred embodiment and FIG. 3(b) is a plan view showing the bottom surface of the nitride semiconductor substrate.
Figure 3:
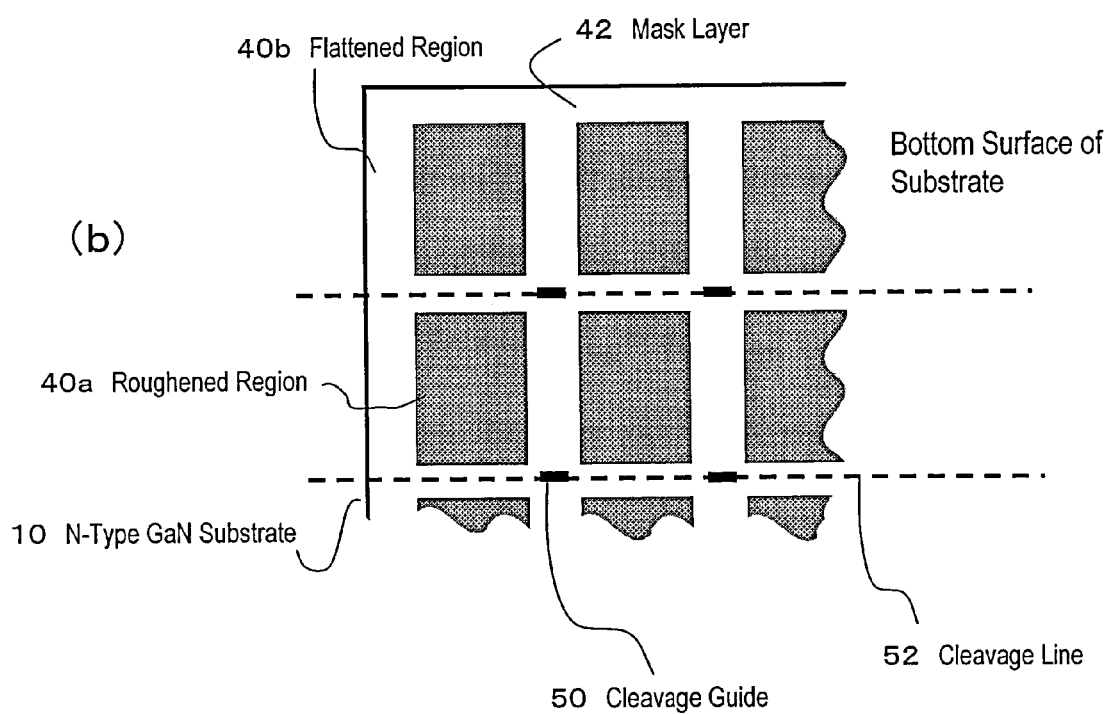

Next, the substrate is subjected to the primary cleavage along the dashed lines shown in FIG. 3(b). FIGS. 5(a) and 5(b) schematically illustrate a process step of cutting a bar 10a from a semiconductor substrate by the primary cleavage. By subjecting the bar 10a, obtained by the primary cleavage, to a secondary cleavage, the semiconductor laser shown in FIG. 2 can be obtained. The direction of the secondary cleavage is perpendicular to that of the primary cleavage.

According to this preferred embodiment, the n-electrode is formed so as to have the roughened region 40a as its contact surface, and therefore, the effective area of the contact can be increased and the concentration of carbon on the contact surface can be decreased. As a result, the contact resistance of the n-electrode can be reduced. In addition, since the cleavage guides can be located from the bottom surface of the substrate as shown in FIG. 3(b), the cleavage can be carried out at a good yield, too. It should be noted that in each of the semiconductor laser devices that have been cut out from the substrate by the cleavage, the flattened region 40b on the bottom surface of its substrate is arranged so as to be adjacent to the cleaved portion.

Also, in each of the semiconductor laser devices that have been cut out from the substrate by the cleavage, the flattened region 40b on the bottom surface of its substrate has the shape of a band with a width of 20 µm or more and surrounds the roughened region 40a (see FIG. 3(b)).

The layout of the flattened regions 40b on the bottom surface of the substrate is not limited to the example illustrated in FIG. 3(b). Alternatively, the flattened regions 40b may also be defined anywhere as long as the cleavage guides 50 can be located from the bottom surface of the substrate.

Embodiment 2

Hereinafter, another preferred embodiment of a nitride semiconductor device according to the present invention will be described with reference to FIGS. 6 and 7.

Figure 6:
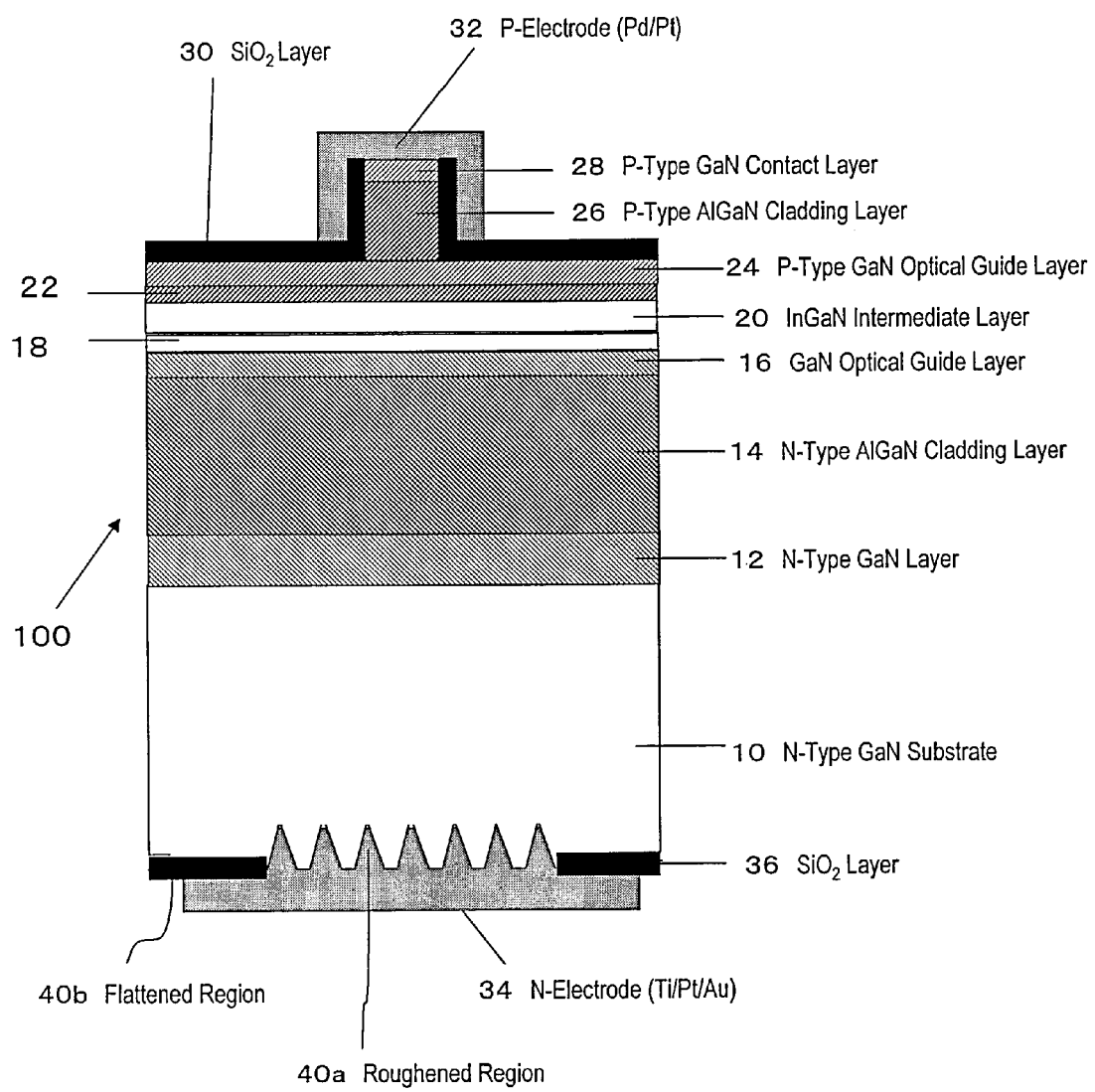
FIG. 6 is a cross-sectional view illustrating another preferred embodiment of a nitride semiconductor device according to the present invention.

The preferred embodiment illustrated in FIG. 6 has the same configuration as the semiconductor laser device of the first preferred embodiment described above except that the flattened region on the bottom surface of the n-type GaN substrate is covered with an insulating layer 36.

As shown in FIG. 6, an insulating layer 36 such as an $SiO_2$ film may be left on a portion of the bottom surface of the substrate. The insulating film needs to be removed from the area where the n-electrode 34 contacts with the bottom surface of the substrate. However, even if a part of the insulating film is left as the insulating layer 36 around the n-electrode 34, the contact properties will not be affected. Also, by leaving the insulating layer 34 of $SiO_2$, for example, on the bottom surface of the substrate, the insulating layer 34 can absorb the light (stray light) that has leaked from the active layer 18 to the substrate 10 and can reduce the noise, too.

Figure 7:
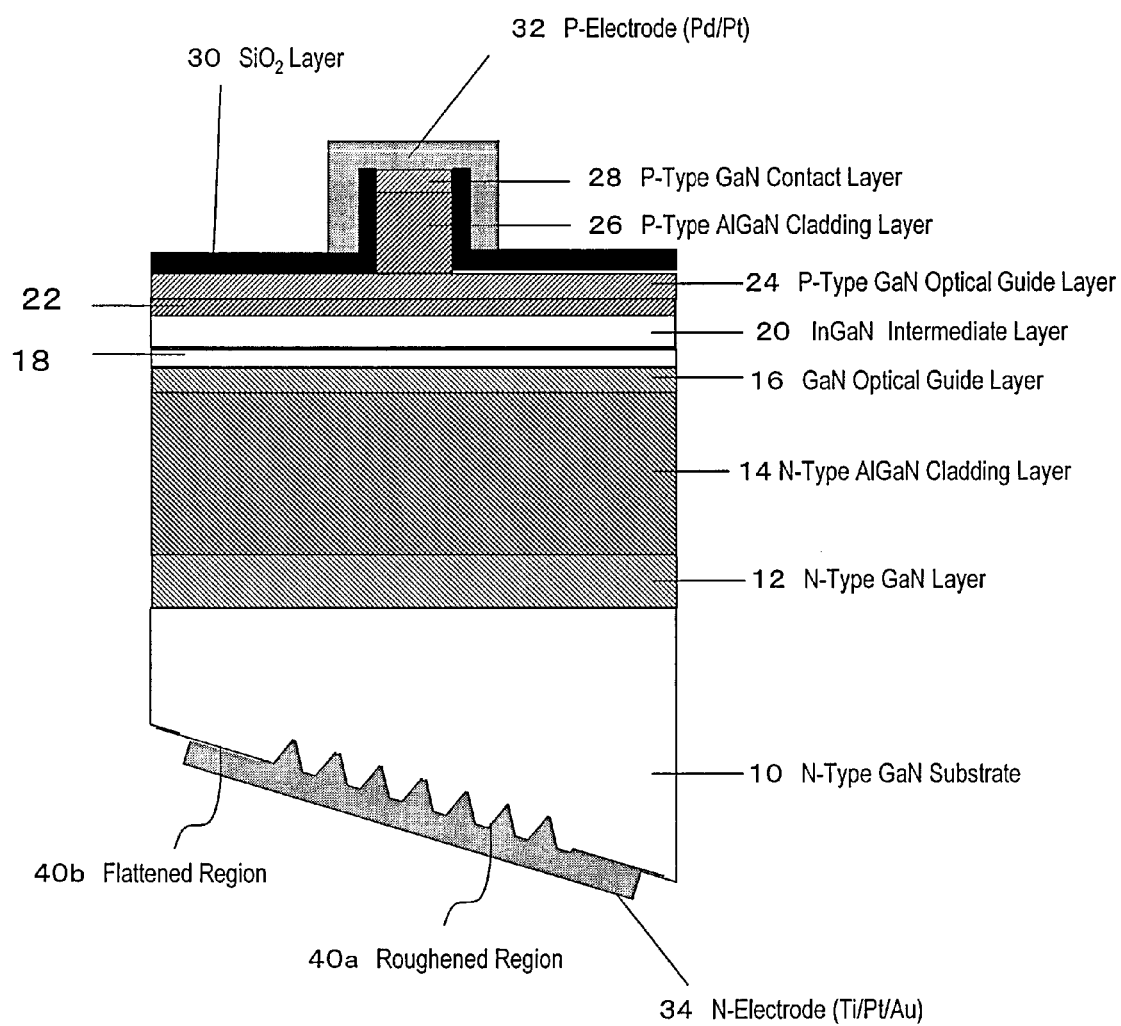
FIG. 7 is a cross-sectional view illustrating still another preferred embodiment of a nitride semiconductor device according to the present invention.

The preferred embodiment illustrated in FIG. 7 has the same configuration as the semiconductor laser device of the first preferred embodiment described above except that the bottom surface of the substrate is tilted. As shown in FIG. 7, the bottom surface of the substrate may define a tilt angle with respect to the N planes. Such a structure can be formed by fixing the substrate with respect to a polishing platen such that the bottom surface thereof to be polished defines a predetermined tilt angle with respect to the platen.

According to the present invention, the contact resistance can be reduced in the interface between the bottom surface of the substrate and the n-electrode, thus making it now possible to use various metals, which have never been used in the prior art, as materials for the n-electrode. More specifically, at least one metal selected from the group consisting of Ti, Al, Pt, Au, Mo, Sn, In, Ni, Cr, Nb, Ba, Ag, Rh, Ir, Ru and Hf or an alloy thereof can now be used.

In the preferred embodiments described above, a GaN substrate is used as a nitride semiconductor substrate. However, the nitride semiconductor substrate does not have to be made of GaN but may also be made of AlGaN, InGaN or any other suitable compound. Optionally, the substrate may even be an off-substrate.

INDUSTRIAL APPLICABILITY

The present invention improves the contact properties of an n-electrode in a nitride semiconductor device, which is expected to be used as a short-wave light source or a device with high breakdown voltage, and therefore, contributes to mass-producing nitride semiconductor lasers with high reliability.

The invention claimed is:

1. A nitride semiconductor device comprising:
    a nitride-based semiconductor substrate containing an n-type dopant and having a principal surface and a bottom surface;
    a semiconductor multilayer structure formed on the principal surface of the semiconductor substrate, the semiconductor multilayer structure including a p-type region and an n-type region;
    a p-electrode being in contact with a portion of the p-type region included in the semiconductor multilayer structure; and
    an n-electrode arranged on the bottom surface of the semiconductor substrate,
    wherein the bottom surface of the semiconductor substrate includes a flattened region and a roughened region, and
    wherein the n-electrode covers the roughened region at least partially.

2. The nitride semiconductor device of claim 1, wherein the flattened region on the bottom surface of the semiconductor substrate has the shape of a band with a width of 20 µm or more and surrounds the roughened region.

3. The nitride semiconductor device of claim 1, wherein contours of an area of contact between the bottom surface of the semiconductor substrate and the n-electrode are aligned with a boundary between the flattened region and the roughened region.

4. The nitride semiconductor device of claim 1, wherein the flattened region on the bottom surface of the semiconductor substrate has been subjected to a polishing process or a cleaning process.

5. The nitride semiconductor device of claim 1, wherein the principal surface of the semiconductor substrate has +C polarity.

6. The nitride semiconductor device of claim 1, wherein the flattened region on the bottom surface of the semiconductor substrate has –C polarity.

7. The nitride semiconductor device of claim 1, wherein the roughened region on the bottom surface of the semiconductor substrate includes a plurality of recessed portions or raised portions that have been formed by an etching process.

8. The nitride semiconductor device of claim 1, wherein the roughened region on the bottom surface of the semiconductor substrate includes a plurality of facets with multiple different plane orientations.

9. The nitride semiconductor device of claim 1, wherein on the bottom surface of the semiconductor substrate, the roughened region has a level difference of 10 nm to 1 µm and the flattened region has a level difference of less than 10 nm.

10. The nitride semiconductor device of claim 1, wherein the n-electrode covers the roughened region entirely on the bottom surface of the semiconductor substrate.

11. The nitride semiconductor device of claim 1, wherein the flattened region on the bottom surface of the semiconductor substrate is arranged so as to be in contact with a cleaved portion.

12. The nitride semiconductor device of claim 1, wherein the n-electrode includes a layer that is made of at least one metal selected from the group consisting of Ti, Al, Pt, Au, Mo, Sn, In, Ni, Cr, Nb, Ba, Ag, Rh, Ir, Ru and Hf or an alloy thereof.

13. The nitride semiconductor device of claim 1, wherein the n-electrode has a contact resistivity of $5 \times 10^{-4}$ $\Omega \cdot cm^2$ or less.

14. The nitride semiconductor device of claim 1, wherein the flattened region on the bottom surface of the semiconductor substrate is a polished plane.

15. A method for fabricating a nitride semiconductor device, the method comprising the steps of:
    providing a nitride-based semiconductor substrate containing an n-type dopant and having a principal surface and a bottom surface;
    forming a semiconductor multilayer structure, including a p-type region and an n-type region, on the principal surface of the semiconductor substrate;

forming a p-electrode on the p-type region that is included in the semiconductor multilayer structure; and forming an n-electrode on the bottom surface of the semiconductor substrate that includes a nitrogen plane, wherein the method further includes the steps of:

defining a flattened region and a roughened region on the bottom surface of the semiconductor substrate before the n-electrode is formed there; and cleaving the semiconductor substrate such that a cleaved surface runs through the flattened region after the n-electrode has been formed.

16. The method of claim 15, further comprising the step of reducing the concentration of carbon on the bottom surface of the semiconductor substrate after the step of defining the flattened region and the roughened region on the bottom surface of the semiconductor substrate has been performed and before the step of forming the n-electrode on the bottom surface of the semiconductor substrate is performed.

17. The method of claim 15, wherein the step of reducing the carbon concentration includes the steps of:

forming an insulating film on the bottom surface of the semiconductor substrate; and removing the insulating film.

18. The method of claim 15, wherein the step of reducing the carbon concentration includes the steps of:

depositing a silicon dioxide film on the bottom surface of the semiconductor substrate; and removing the silicon dioxide film.

19. The method of claim 15, wherein the step of defining the roughened region includes the steps of:

forming a mask layer, which has an opening to expose a portion of the bottom surface of the semiconductor substrate where the roughened region will be defined, on the bottom surface of the semiconductor substrate; and subjecting that portion of the bottom surface of the semiconductor substrate where the roughened region will be defined to an etching process.

20. The method of claim 19, wherein the step of forming the n-electrode includes the steps of:

depositing a metallic electrode layer over the mask layer on the bottom surface of the semiconductor substrate; and patterning the metallic electrode layer into the n-electrode by removing a portion of the metallic electrode layer, which is located on the mask layer, along with the mask layer.

* * * * *

UNITED STATES PATENT AND TRADEMARK OFFICE
CERTIFICATE OF CORRECTION

PATENT NO. : 7,606,276 B2
APPLICATION NO. : 11/570147
DATED : October 20, 2009
INVENTOR(S) : Yoshiaki Hasegawa, Akihiko Ishibashi and Toshiya Yokogawa It is certified that error appears in the above-identified patent and that said Letters Patent is hereby corrected as shown below:

Title page item (86), after "PCT No.:" should read -- , PCT/JP2006/309550 --.

Title page item (*), "308 days" should read -- 378 days --.

Signed and Sealed this

Fifth Day of January, 2010

David J. Kappos
*Director of the United States Patent and Trademark Office*